US012633487B2

(12) United States Patent (10) Patent No.: US 12,633,487 B2
Ishikawa et al. (45) Date of Patent: May 19, 2026

(54) ELECTRON SOURCE AND METHOD FOR MANUFACTURING SAME, AND EMITTER AND DEVICE PROVIDED WITH SAME

(71) Applicant: Denka Company Limited, Tokyo (JP)

(72) Inventors: Daisuke Ishikawa, Tokyo (JP); Hiromitsu Chatani, Tokyo (JP)

(73) Assignee: Denka Company Limited, Tokyo (JP)

( * ) Notice: Subject to any disclaimer, the term of this patent is extended or adjusted under 35 U.S.C. 154(b) by 0 days.

(21) Appl. No.: 17/996,520

(22) PCT Filed: Apr. 14, 2021

(86) PCT No.: PCT/JP2021/015486
§ 371 (c)(1),
(2) Date: Oct. 19, 2022

(87) PCT Pub. No.: WO2021/215335
PCT Pub. Date: Oct. 28, 2021

(65) Prior Publication Data
US 2023/0317395 A1 Oct. 5, 2023

(30) Foreign Application Priority Data
Apr. 21, 2020 (JP) ................................. 2020-075320

(51) Int. Cl.
*H01J 9/04* (2006.01)
*H01J 37/06* (2006.01)

(52) U.S. Cl.
CPC ................ *H01J 9/04* (2013.01); *H01J 37/06* (2013.01); *H01J 2237/06308* (2013.01)

(58) Field of Classification Search
CPC .. H01J 9/042; H01J 1/16; H01J 37/063; H01J 1/148; H01J 2201/196; H01J 2237/06308; H01J 9/04
See application file for complete search history.

(56) References Cited

U.S. PATENT DOCUMENTS

2009/0324324 A1* 12/2009 Hashimoto ............. F16B 17/00
29/505
2011/0240855 A1 10/2011 Ohshima et al.
(Continued)

FOREIGN PATENT DOCUMENTS

EP        2 680 294 A1    1/2014
JP     2012-069364 A    4/2012
(Continued)

OTHER PUBLICATIONS

Japan Patent Office, International Search Report issued in International Application No. PCT/JP2021/015486 (May 25, 2021).
(Continued)

*Primary Examiner* — Elmito Breval
(74) *Attorney, Agent, or Firm* — Leydig, Voit & Mayer, Ltd.

(57) ABSTRACT

A method for manufacturing an electron source according to the present disclosure includes steps of: (A) preparing a first member provided with a columnar portion made of a first material having an electron emission characteristic, (B) preparing a second member which has a higher work function and a lower strength than the first material, and in which a hole is formed extending in a direction from one end surface toward the other end surface, and (C) pushing the columnar portion into the hole in the second member, wherein the first member has a cross-sectional shape that is dissimilar to the cross-sectional shape of the hole; and in the step (C), by pressing the columnar portion into the hole, a portion of a side surface of the columnar portion scrapes the inner surface of the hole and bites into the second member, thereby fixing the columnar portion to the second member.

13 Claims, 8 Drawing Sheets

(56) References Cited

U.S. PATENT DOCUMENTS

| | | | | | |
|---|---|---|---|---|---|
| 2014/0055025 A1* | 2/2014 | Yasuda | ..................... | H01J 1/26 | 313/364 |
| 2015/0357146 A1* | 12/2015 | Saito | ....................... | H01J 3/022 | 445/3 |
| 2017/0148605 A1* | 5/2017 | Tesch | .................... | H01J 35/064 | |
| 2019/0221399 A1 | 7/2019 | Morishita et al. | | | |
| 2019/0385809 A1 | 12/2019 | Kusunoki et al. | | | |

FOREIGN PATENT DOCUMENTS

| | | | |
|---|---|---|---|
| JP | 2013-246917 A | 12/2013 | |
| JP | 5525104 B2 | 6/2014 | |
| JP | 2018-142453 A | 9/2018 | |
| WO | WO 2005/124815 A1 | 12/2005 | |
| WO | WO 2012/114521 A1 | 8/2012 | |

OTHER PUBLICATIONS

The International Bureau of WIPO, International Preliminary Report on Patentability issued in International Application No. PCT/JP2021/015486 (Nov. 3, 2022).
European Patent Office, Extended European Search Report issued in European Patent Application No. 21793715.0 (Jun. 6, 2023).

* cited by examiner

*Fig.4A*
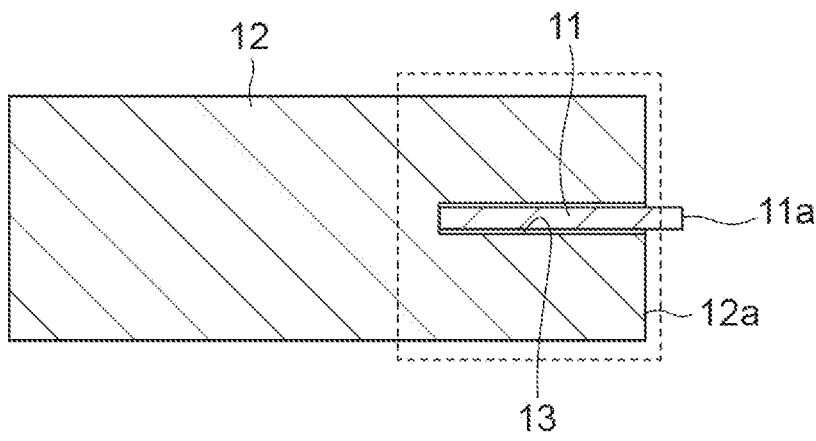
*Fig.4B*
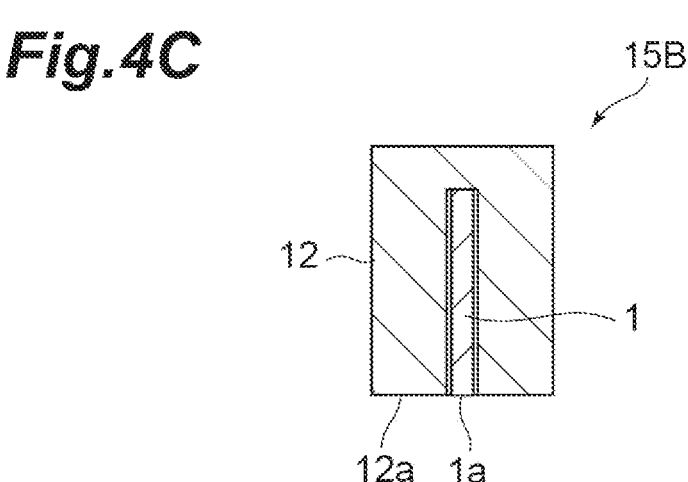
*Fig.4C*

ELECTRON SOURCE AND METHOD FOR MANUFACTURING SAME, AND EMITTER AND DEVICE PROVIDED WITH SAME

CROSS-REFERENCE TO RELATED APPLICATIONS

This patent application is the U.S. national phase of International Application No. PCT/JP2021/015486, filed on Apr. 14, 2021, which claims the benefit of Japanese Patent Application No. 2020-075320, filed Apr. 21, 2020, the disclosures of which are incorporated herein by reference in their entireties for all purposes.

TECHNICAL FIELD

The present disclosure relates to an electron source, a method for manufacturing the same, an emitter, and a device provided with the same.

BACKGROUND ART

An emitter provided with an electron source is used, for example, in an electron microscope and a semiconductor inspection device. An emitter disclosed in Patent Literature 1 has a first member having an electron emission characteristic and a second member covering the first member, and a groove having a predetermined size is provided between the first member and the second member. An electron gun disclosed in Patent Literature 2 includes an electron gun cathode and a holder holding the electron gun cathode, the electron gun cathode has a quadrangular flat surface at a tip thereof, and a tip portion thereof is exposed and protrudes from the holder (see FIG. 6 of Patent Literature 2).

CITATION LIST

Patent Literature

[Patent Literature 1] Japanese Unexamined Patent Publication No. 2012-69364
[Patent Literature 2] Japanese Patent No. 5525104

SUMMARY OF INVENTION

Technical Problem

An electron source is extremely minute. Paragraph [0055] of Patent Literature 2 describes that a size of the electron gun cathode is 50 μm×50 μm×100 μm. A skilled technique is required to manufacture an electron source configured of such a minute component.

The present disclosure provides a method for manufacturing an electron source that is useful for efficiently manufacturing a minute electron source. In addition, the present disclosure provides an electron source and an emitter provided with the electron source, which can sufficiently inhibit a member emitting electrons from coining off a member holding it. Further, the present disclosure provides a device provided with the emitter.

Solution to Problem

One aspect of the present disclosure relates to a method for manufacturing an electron source. The manufacturing method includes the steps of: (A) preparing a first member provided with a columnar portion made of a first material having an electron emission characteristic; (B) preparing a second member which has a higher work function and a lower strength than the first material, and in which a hole extending in a direction from one end face toward the other end face is formed; and (C) pressing the column into the hole in the second member, wherein the columnar portion has a cross-sectional shape that is dissimilar to a cross-sectional shape of the hole of the second member, and in step (C), by pressing the columnar portion into the hole, a portion of a side surface of the columnar portion scrapes an inner surface of the hole and bites into the second member, thereby fixing the columnar portion to the second member.

According to the above manufacturing method, by adopting the second member having a lower strength than the first member, as described above, the part of the side surface of the columnar portion of the first member scrapes the inner surface of the hole and bites into the second member, so that the columnar portion can be fixed to the second member. For this reason, the electron source can be manufactured without strictly matching a size of the columnar portion with a size of the hole.

One aspect of the present disclosure relates to an electron source. The electron source is provided with a columnar portion made of a first material having an electron emission characteristic, and a tubular portion that is disposed to surround the columnar portion and made of a second material having a higher work function and a lower strength than the first material, wherein a hole extending in a direction from one end face toward the other end face is formed in the tubular portion, and the columnar portion has a cross-sectional shape that is dissimilar to a cross-sectional shape of the hole in the tubular portion and is fixed to the tubular portion in a biting engagement with the tubular portion.

According to the above electron source, it is possible to sufficiently inhibit the member (columnar portion) emitting electrons from coining off the member (tubular portion) holding it.

An emitter according to one aspect of the present disclosure is provided with the electron source. A device according to one aspect of the present disclosure is provided with the emitter. Examples of the device provided with the emitter include, for example, an electron microscope, a semiconductor manufacturing device, an inspection device, and a machining device.

Advantageous Effects of Invention

According to the present disclosure, a method for manufacturing an electron source that is useful for efficiently manufacturing a minute electron source is provided. In addition, according to the present disclosure, an electron source and an emitter provided with the electron source that can sufficiently inhibit a member emitting electrons from coining off a member holding it are provided. Further, according to the present disclosure, a device provided with the emitter is provided.

BRIEF DESCRIPTION OF DRAWINGS

FIG. 4A to 4C are cross-sectional views schematically showing a process of manufacturing the electron source shown in FIG. 1.

DESCRIPTION OF EMBODIMENTS

Figure 1:
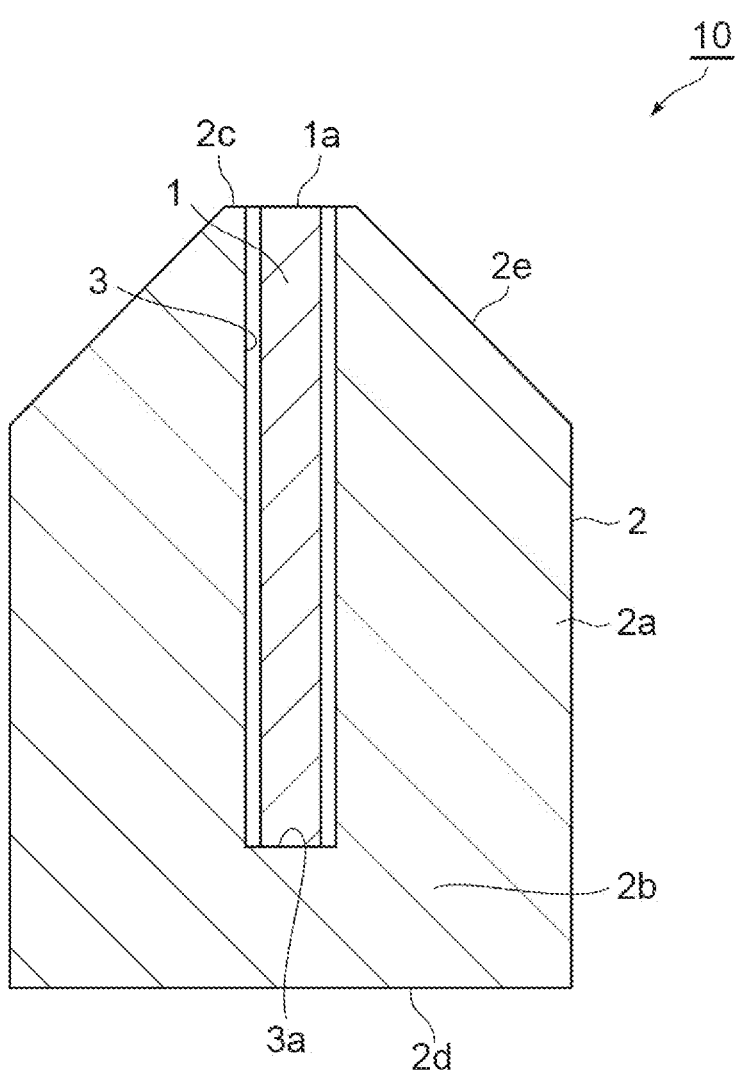
FIG. 1 is a cross-sectional view schematically showing one embodiment of an electron source according to the present disclosure.

Embodiments of the present disclosure will be described below with reference to the drawings. In addition, in the following description, the same reference numerals will be used for the same elements or elements having the same functions, and repeated description thereof will be omitted. Also, the present invention is not limited to the following embodiments.

<Electron Source>

Figure 2:
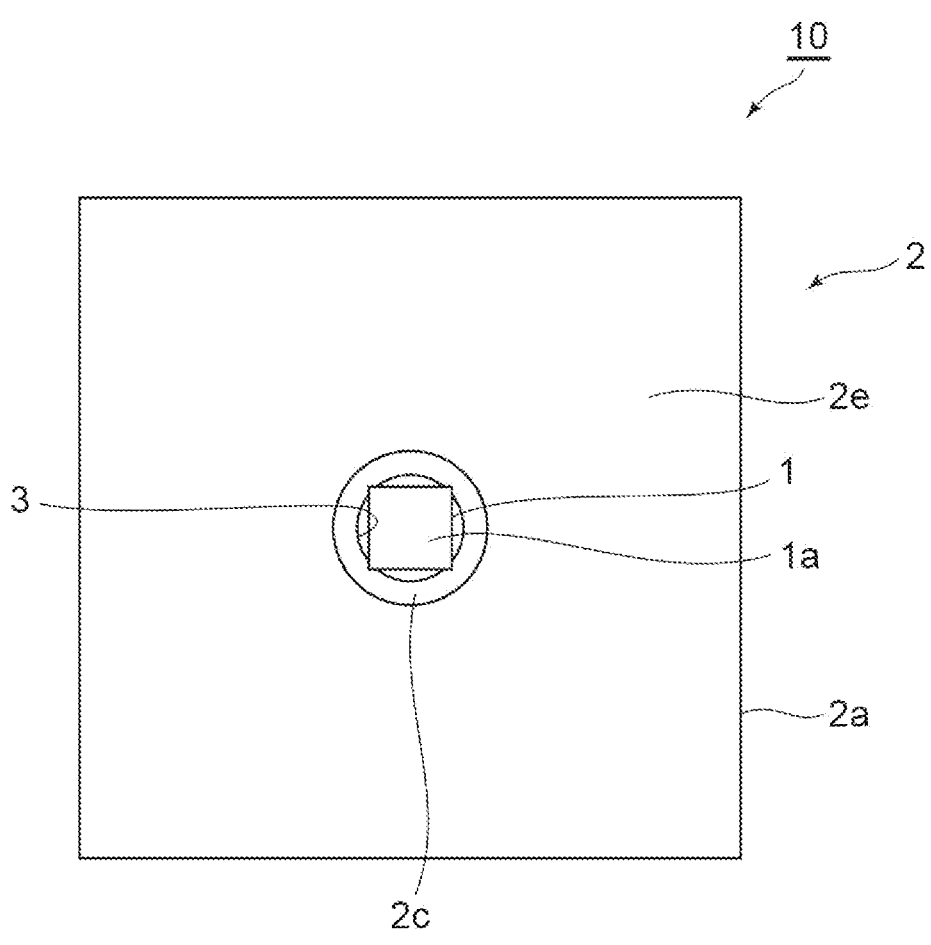
FIG. 2 is a plan view showing a configuration of a tip of the electron source shown in FIG. 1.

FIG. 1 is a cross-sectional view schematically showing an electron source according to the present embodiment. FIG. 2 is a plan view showing a configuration of a tip of the electron source 10 shown in FIG. 1. The electron source 10 is provided with a columnar portion 1 and an electron emission limiting member 2 disposed to surround the columnar portion 1. The columnar portion 1 is made of a first material (an electron emission material) having an electron emission characteristic. An end face 1a of the columnar portion 1 is an electron emission surface, and a normal line thereof is in an electron emission direction. On the other hand, the electron emission limiting member 2 is made of a second material (an electron emission limiting material) having a larger work function and a lower strength than the first material. The electron emission limiting member 2 has a tubular portion 2a in which a hole 3 is formed and a base end portion 2b in which the hole 3 is not formed. The base end portion 2b forms a bottom 3a of the hole 3. The hole 3 extends in a direction from an end face 2c toward the other end face 2d of the electron emission limiting member 2. In the present embodiment, an opening area of the hole 3 is constant from the end face 2c toward the end face 2d.

As shown in FIG. 2, the columnar portion 1 has a cross-sectional shape dissimilar to a cross-sectional shape of the hole 3 of the electron emission limiting member 2 and is fixed to the electron emission limiting member 2 in a biting engagement the tubular portion 2a. In the present embodiment, in a cross-section orthogonal to a longitudinal direction of the columnar portion 1, a shape of the columnar portion 1 is substantially square, and a shape of the hole 3 is substantially circular. According to the electron source 10, it is possible to sufficiently inhibit the columnar portion 1 from coining off the electron emission limiting member 2.

A flat surface is formed on a tip face of the electron source 10 by the end face 1a (electron emission surface) of the columnar portion 1 and the end face 2c of the electron emission limiting member 2. Further, the entire side surface of the columnar portion 1 is covered with the tubular portion 2a. Since the columnar portion 1 does not protrude from the tubular portion 2a in this way, it is possible to sufficiently inhibit unnecessary emission of electrons, that is, side emission of electrons. For example, in order to obtain electrons with a larger current, a tip portion of the electron source 10 is heated to a high temperature of about 1550° C. and a high electric field of several kV is applied to the electron source 10. When such a high electric field is applied, surplus electrons may be generated from portions other than the tip portion of the electron source. Due to the space-charge effect, the surplus electrons may reduce brightness of an electron beam from the tip portion and may cause unnecessary heating of peripheral electrode components. In order to prevent this, by exposing only the electron emission portion (end face 1a of the columnar portion 1) of the electron source 10 and covering other surfaces with the tubular portion 2a, only a high-brightness electron beam from the tip portion can be obtained. Also, the term "flat surface" used herein means that a difference in level between the end face 1a and the end face 2c is less than 2 μm. As long as this difference in level is less than 2 μm, the columnar portion 1 may protrude from the tubular portion 2a, or the end face 1a may be recessed from the end face 2c. This difference in level may be less than 1.5 μm or less than 1.0 μm.

By covering the entire side surfaces of the columnar portion 1 with the tubular portion 2a, the effect that occurrence of a phenomenon called a micro-discharge can be inhibited is also achieved. That is, in thermionic emission, electrons are emitted by heating an electron source to a high temperature. Along with this, when an electron emission material evaporates, it adheres to peripheral electrode components and forms fibrous crystals called whiskers. When charges are accumulated in the whiskers, micro-discharges are caused. The micro-discharges destabilize an electron beam and cause degradation of device performance. By covering the entire side surfaces of the columnar portion 1 with the tubular portion 2a, the sublimated electron emission material is trapped in the tubular portion 2a, which can reduce an amount of adhesion thereof to the peripheral electrode components and make the micro-discharges less likely to occur. Also, the tubular portion 2a covers the entire side surface of the columnar portion 1 without a gap partially in a circumferential direction thereof. Since the tubular portion 2a does not have any gap, side emission of electrons can be sufficiently inhibited.

(Electron Emission Material)

The columnar portion 1 is made of an electron emission material (a first material). An electron emission material is a material that emits electrons when heated. An electron emission material has a lower work function than an electron emission limiting material and a higher strength than an electron emission limiting material. Examples of the electron emission material may include rare earth borides such as lanthanum boride (LaB$_6$) and cerium boride (CeB$_6$); high melting point metals such as tungsten, tantalum, hafnium and their oxides, carbides and nitrides; and noble metal—rare earth alloys such as iridium cerium. Work functions of these materials are as follows:

Lanthanum boride (LaB$_6$): 2.8 eV

Cerium boride (CeB$_6$): 2.8 eV

Tantalum carbide: 3.2 eV

Hafnium carbide: 3.3 eV

From the viewpoint of the electron emission characteristic, strength, and workability, the electron emission material forming the columnar portion 1 is preferably a rare earth boride. In a case in which the columnar portion 1 is made of a rare earth boride, the columnar portion 1 is preferably a single crystal machined such that the <100> orientation, which has a low work function and is likely to emit electrons, coincides with the electron emission direction. The columnar portion 1 can be formed into a desired shape by electrical discharge machining or the like. Since it is considered that an evaporation rate is slow on the side surfaces of the columnar portion 1, they are preferably (100) crystal planes.

In the present embodiment, a shape of the columnar portion 1 is a quadrangular prism shape (see FIGS. 1 and 2). A length of the columnar portion 1 is preferably 0.1 to 1 mm, more preferably 0.2 to 0.6 mm, and still more preferably about 0.3 mm. When the length is 0.1 mm or more, handling tends to be good, and when the length is 1 mm or less, cracks and the like tend to be less likely to occur. A cross-sectional shape of the columnar portion 1 is substantially square. Lengths of its sides are preferably 20 to 300 μm, more preferably 50 to 150 μm, and still more preferably about 100 μm.

(Electron Emission Limiting Material)

The electron emission limiting member 2 is made of an electron emission limiting material. An electron emission limiting material has a higher work function and a lower strength than an electron emission material. By covering the side surfaces of the columnar portion 1 with the electron emission limiting member 2, electron emission from the side surfaces of the columnar portion 1 is inhibited.

A difference ($\Delta W = W_2 - W_1$) between a work function $W_2$ of the electron emission limiting member 2 and a work function $W_1$ of the columnar portion 1 is preferably 0.5 eV or more, more preferably 1.0 eV or more, and still more preferably 1.6 eV or more.

The electron emission limiting material preferably contains a high melting point metal or carbides thereof, and preferably contains at least one of metal tantalum, metal titanium, metal zirconium, metal tungsten, metal molybdenum, metal rhenium, tantalum carbide, titanium carbide, and zirconium carbide. Also, the electron emission limiting material may include at least one of boron carbide and graphite (a carbon material). Also, the electron emission limiting material may include at least one of niobium, hafnium, and vanadium. Glassy carbon (for example, Glassy Carbon (trade name, manufactured by Reiho Manufacturing Co., Ltd.)) may be used for the electron emission limiting material. Work functions of these materials are as follows:

Metal rhenium: 4.9 eV

Boron carbide: 5.2 eV

Graphite: 5.0 eV

As described above, the strength of the electron emission limiting material is lower than that of the electron emission material. The strengths of both materials can be evaluated, for example, by Vickers hardness. From the viewpoint of proper strength and workability, the material constituting the electron emission limiting member 2 preferably has a Vickers hardness of about 100 HV to 1900 HV. For example, glassy carbon (having a Vickers hardness of about 230 HV) is suitable for the electron emission limiting material in that it has a moderate strength. A tip portion 2e (a portion of the tubular portion 2a) of the electron emission limiting member 2 is machined into a tapered shape, and the remaining portions (the remaining portion of the tubular portion 2a, and the base end portion 2b) are machined into a quadrangular prism shape. By machining the tip portion 2e of the electron emission limiting member 2 into a tapered shape, the effect that an electric field can be easily concentrated and electron emission efficiency can be improved is achieved. Also, a support member (not shown) may be provided around the electron emission limiting member 2.

The electron emission material and the electron emission limiting material may be appropriately selected, for example, from the viewpoint of their work functions and strengths and used in combination. Suitable examples of the electron emission material include lanthanum boride (LaB$_6$), cerium boride (CeB$_6$), hafnium carbide, and iridium cerium. Suitable examples of the electron emission limiting material include metallic rhenium, boron carbide, and graphite (including glassy carbon). Also, some materials that can be used for the electron emission material can also be used for the electron emission limiting material. For example, materials having a work function of about 3.2 to 4.5 eV can be used for both the electron emission material and the electron emission limiting material. Such materials include metal tungsten (having a work function of 4.5 eV), metal tantalum (having a work function of 3.2 eV), and hafnium carbide (having a work function of 3.3 eV).

<Method for Manufacturing Electron Source>

Next, a method for manufacturing the electron source 10 will be described. The electron source 10 is manufactured through the following steps.

Figure 3A:
FIG. 3A is a cross-sectional view schematically showing a first member provided with a columnar portion.
Figure 3B:
FIG. 3B is a plan view showing a tip portion of the first member shown in FIG. 3A.

(A) Preparing a columnar first member 11 (see FIGS. 3A and 3B).

Figure 3C:
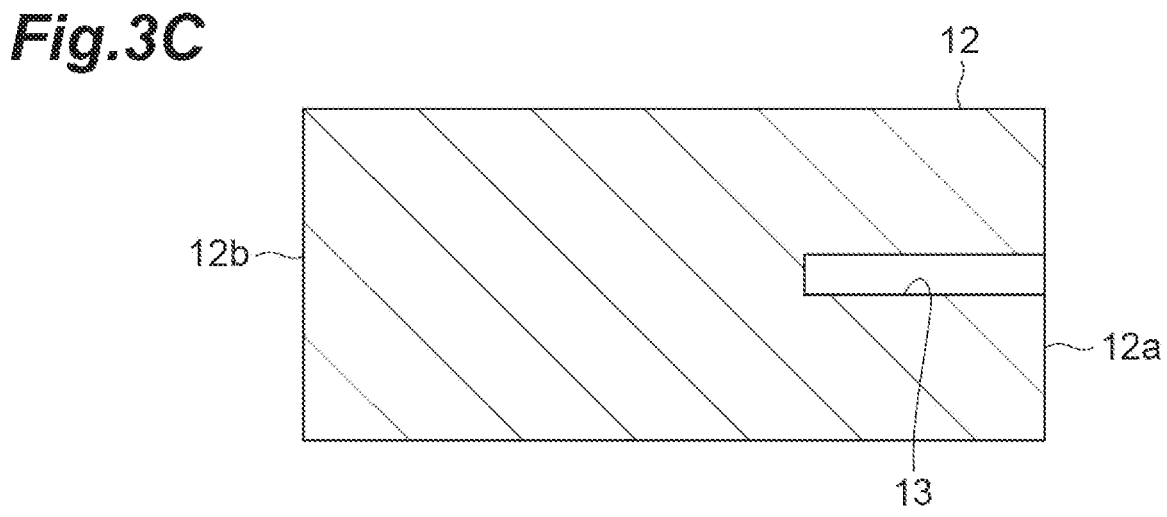
FIG. 3C is a cross-sectional view schematically showing a second member in which a hole is formed.

(B) Preparing a second member 12, which has a larger work function and a lower strength than the first member 11, and in which a hole 13 extending in a direction from one end face 12a toward the other end face 12b is formed (see FIG. 3C).

(C) Pressing the first member 11 into the hole 13 of the second member 12 (see FIG. 4A).

In the above step (C), by pressing the first member 11 into the hole 13, parts of the side surfaces of the first member 11 scrape an inner surface of the hole 13 and bite into the second member 12, and thus the first member 11 is fixed to the second member 12. Also, although FIG. 4A illustrates a state in which the first member 11 reaches deep into the hole 13, the first member 11 does not have to reach deep into the hole 13.

The first member 11 shown in FIGS. 3A and 3B is made of an electron emission material. The first member 11 can be obtained by electrical discharge machining or the like from a block of the electron emission material. The first member 11 is a portion serving as the columnar portion 1 of the electron source 10.

The second member 12 shown in FIG. 3C is made of an electron emission limiting material. The second member 12 may be obtained by electrical discharge machining or the like from a block of the electron emission limiting material. The hole 13 of the second member 12 is a portion serving as the hole 3 of the electron source 10. An opening area of hole 13 is constant from the end face 12a toward the end face 12b.

Figure 5:
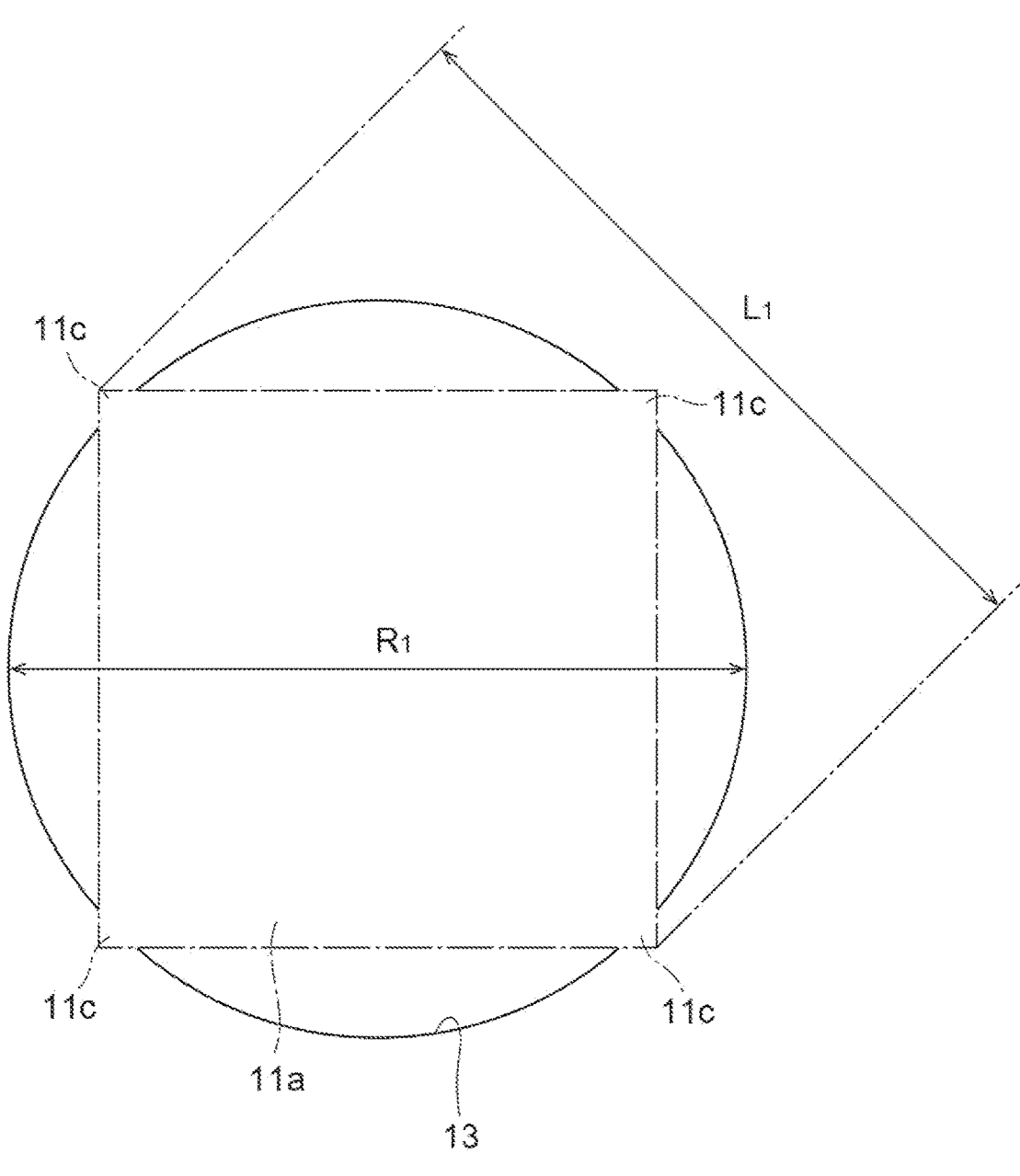
FIG. 5 is a plan view showing a relationship in size between the columnar portion (having a substantially square cross-sectional shape) of the first member and the hole of the second member.

FIG. 4A is a cross-sectional view schematically showing a state in which the first member 11 is pressed into the hole 13 of the second member 12. FIG. 5 is a plan view showing a relationship in size between the cross-section and the hole 13 of the second member 12. Parts of the side surfaces of the first member 11 (four corners 11*c*) bite into the second member 12. The sizes of the first member 11 and the holes 13 preferably satisfy the following condition.

<Condition>

$$L_1/R_1 > 1 \tag{1}$$

In the inequality (1), $L_1$ indicates a length of a diagonal of a cross-section (substantially square) of the first member 11, and $R_1$ indicates a diameter of the hole 13.

A value of $L_1/R_1$ more preferably satisfies the inequality (1a), further preferably satisfies the inequality (1b), and particularly preferably satisfies the inequality (1c).

$$1 < L_1/R_1 < 1.2. \tag{1a}$$

$$1 < L_1/R_1 < 1.1. \tag{1b}$$

$$1 < L_1/R_1 < 1.05. \tag{1c}$$

A structure 15A shown in FIG. 4(*b*) was obtained by cutting out the portion surrounded by the broken line quadrangle in FIG. 4A. In the structure 15A, the first member 11 protrudes from the end face 12*a*. by grounding a protruding portion 11*a* of the first member 11 with, for example, abrasive paper, the end face 1*a* (electron emission surface) is formed, and an outer side of the second member 12 is machined into a quadrangular prism shape. Thus, a quadrangular prism body 15B shown in FIG. 4C is obtained. The electron source 10 shown in FIG. 1 is obtained by tapering one end portion of the quadrangular prism body 15B. Also, an order of machining is not limited thereto, and for example, from the state shown in FIG. 4A, first, the protruding portion 11*a* may be cut to form a flat surface, and then the portion surrounded by the broken line quadrangle in FIG. 4A may be cut out. In addition, the shape of the second member 12 after machining is not limited to a quadrangular prism shape, and for example, in a substantially cylindrical electron source, only the portion sandwiched between heaters may be flattened (see FIG. 6).

According to the above manufacturing method, by adopting the electron emission limiting material having a lower strength than the electron emission material, as described above, parts of the side surfaces of the first member 11 scrape the inner surface of the hole 13 and bite into the second member 12, so that the first member 11 can be fixed to the second member 12. For this reason, the electron source 10 can be manufactured without strictly matching the sizes of the first member 11 and the hole 13.

According to the above manufacturing method, by going through the step of cutting the protruding portion 11*a* of the first member 11, the flat surface is formed at the tip portion of the electron source 10 by the end face 1*a* (electron emission surface) of the columnar portion 1 and the end face 2*c* of the tubular portion 2*a*. Since the columnar portion 1 does not protrude from the tubular portion 2*a*, as described above, unnecessary emission of electrons, that is, side emission of electrons can be sufficiently inhibited, and micro-discharges caused by generation of whiskers can also be inhibited.

In the step (A), a plurality of first members 11 may be prepared, and in the step (B), a plurality of second members 12 each having the hole 13 may be prepared. In this case, prior to performing the step (C), a set of the first member 11 and the second member 12 that satisfies the above conditions is selected, and the step (C) is performed using these members.

<Emitter>

Figure 6:
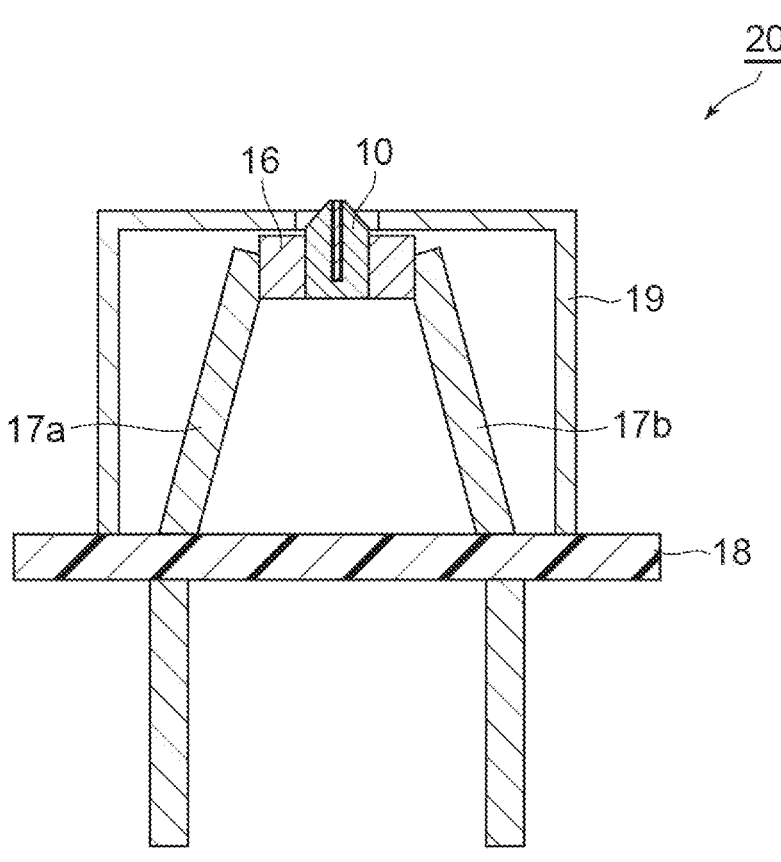
FIG. 6 is a cross-sectional view schematically showing one embodiment of an emitter according to the present disclosure.

FIG. 6 is a cross-sectional view schematically showing an example of an emitter. An emitter 20 shown in FIG. 6 is provided with the electron source 10, a carbon heater 16 disposed around the electron source 10, electrode pins 17*a* and 17*b*, an insulator 18, and a suppressor 19. The carbon heater 16 is for heating the electron source 10. The electrode pins 17*a* and 17*b* are for energizing the carbon heater 16. The suppressor 19 is for inhibiting a surplus current. Also, the electron source 10 may be configured to be heated by means other than the carbon heater 16.

Examples of devices provided with the emitter 20 include an electron microscope, a semiconductor manufacturing device, an inspection device, and a machining device.

Although the embodiment of the present disclosure has been described in detail above, the present invention is not limited to the above embodiment. For example, in the above embodiment, the columnar portion 1 having a substantially square cross-sectional shape has been illustrated (see FIGS. 1 and 2), but the cross-sectional shape of the columnar portion 1 may be substantially polygonal other than substantially square, and for example, it may be substantially rectangular, substantially rhombic, substantially parallelogram, substantially triangular (for example, substantially equilateral triangle), or substantially regular hexagon.

In a case in which the cross-sectional shape of the first member 11 is substantially quadrangular other than substantially square, the above $L_1/R_1$ shows the following values.

$L_1$: a length of a longer diagonal of two diagonals of the substantial quadrangle $R_1$: a diameter of the hole 13

In a case in which an electron source in which the columnar portion 1 has a substantially triangular cross-sectional shape is manufactured, the first member 11 and the hole 13 preferably satisfy the following condition.

<Condition>

Figure 7:
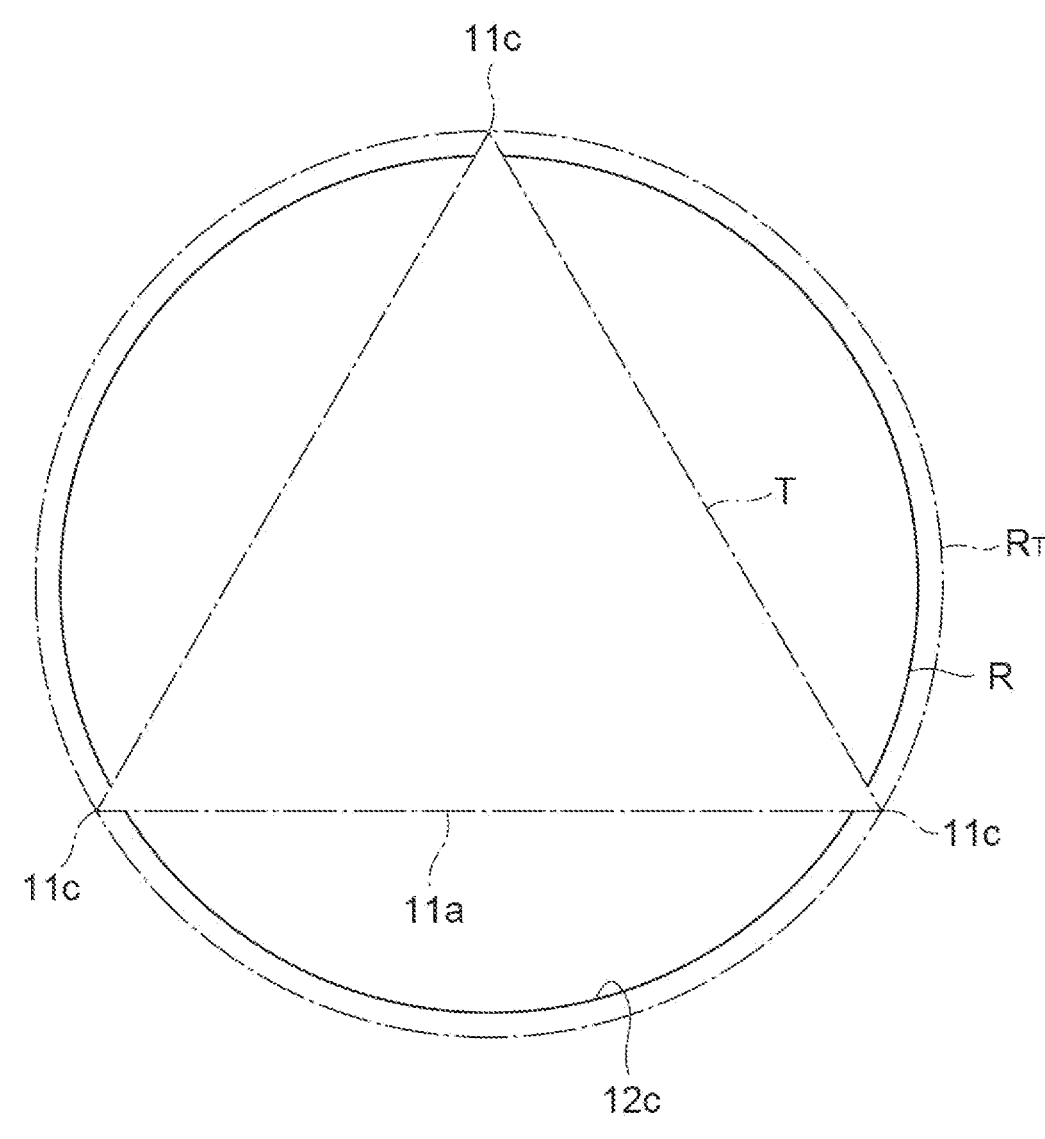
FIG. 7 is a plan view showing a relationship in size between the columnar portion (having a substantially triangular cross-sectional shape) of the first member and the hole of the second member.

When a diameter $R_2$ of a circumscribed circle of a substantial triangle is larger than a diameter $R_1$ of the hole 13 and the substantial triangle is disposed in a circle having the same diameter as the diameter $R_1$ of the hole, at least two corners of the substantial triangle come into contact with the circle. In FIG. 7, a solid-line circle R is a circle with the diameter $R_1$, and a dashed-dotted line circle RT is a circumscribed circle of a substantial triangle T.

Figure 8A:
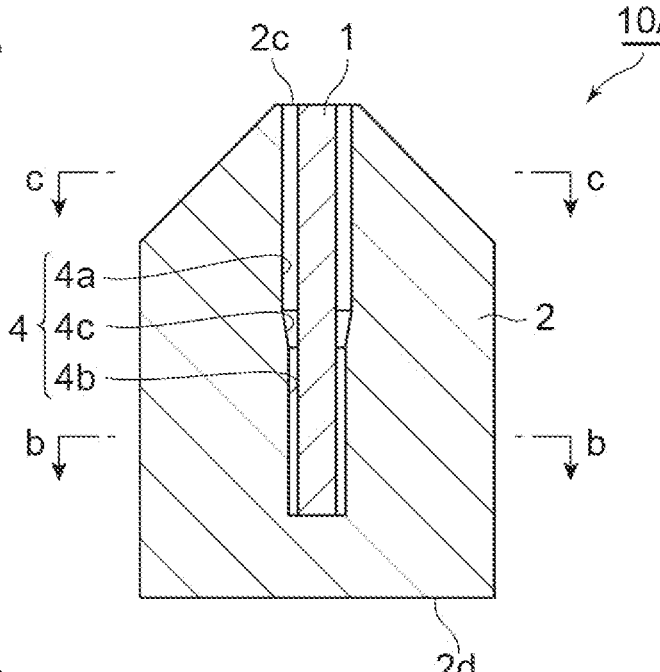
FIG. 8A is a cross-sectional view schematically showing another embodiment of the electron source according to the present disclosure.
Figure 8B:
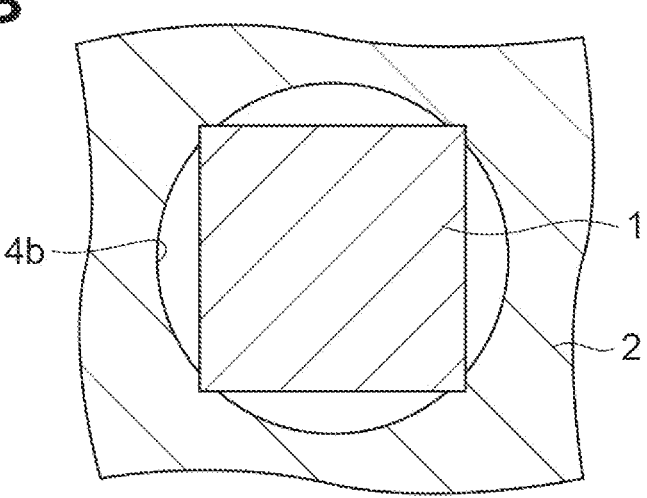
FIG. 8B is an enlarged cross-sectional view along line b-b in FIG. 8A.
Figure 8C:
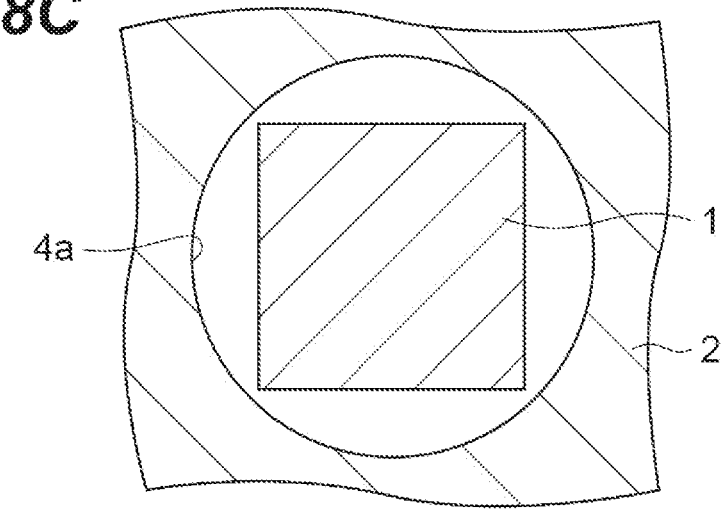
FIG. 8C is an enlarged cross-sectional view along line c-c in FIG. 8A.

In the above embodiment, the case in which the opening area of the hole 3 is constant in the extending direction has been illustrated, but the hole of the electron emission limiting member 2 may have a reduced diameter portion in which the opening area decreases from the end face 2*c* toward the end face 2*d*. An electron source 10A shown in FIG. 8A has the same configuration as the electron source 10 except for the shape of the hole. A hole 4 in the electron source 10A is configured of a hole 4*a* on the end face 2*c* side, a hole 4*b* on the end face 2*d* side, and a tapered portion 4*c* (reduced diameter portion) therebetween. An inner diameter of the hole 4*b* is smaller than an inner diameter of the hole 4*a*. In this case, as shown in FIG. 8B, as long as the columnar portion 1 scrapes an inner surface of the hole 4*b* and bites into the electron emission limiting member 2, thereby being sufficiently fixed, the columnar portion 1 may not bite into the electron emission limiting member 2 in the hole 4*a*, as shown in FIG. 8C. Also, although the tapered portion 4*c* in which the inner diameter continuously decreases has been illustrated as the reduced diameter portion here, the inner diameter of the reduced diameter portion may be gradually reduced. The hole of the second member 12 may similarly have a reduced diameter portion.

INDUSTRIAL APPLICABILITY

According to the present disclosure, the method for manufacturing an electron source that is useful for efficiently manufacturing a minute electron source is provided. Also, according to the present disclosure, the electron source and the emitter provided with the same, which can sufficiently inhibit the member emitting electrons from coining off the member holding it are provided. Further, according to the present disclosure, the device provided with the emitter is provided.

REFERENCE SIGNS LIST

1: Columnar portion, 1a: End face (electron emission surface), 2: Electron emission limiting member, 2a: Tubular portion, 2b: Base end portion, 2c: One end face, 2d: Other end face, 3, 4, 13: Hole, 4c: Tapered portion (reduced diameter portion), 10, 10A: Electron source, 11: First member (columnar portion), 11a: Protruding portion, 11c: Corner portion, 12: Second member, 20: Emitter

The invention claimed is:

1. A method for manufacturing an electron source, the method comprising:
preparing a first member including a columnar portion that extends in a longitudinal direction and that is made of a first material having an electron emission characteristic, wherein in a cross-section of the columnar portion taken orthogonally to the longitudinal direction, the columnar portion has a cross-sectional shape that is substantially square or substantially rectangular, the cross-sectional shape having a diagonal extending from a corner of the columnar portion;
preparing a second member which has a higher work function and a lower strength than the first material, and in which a circular hole that extends in a direction from a first end face of the second member toward a second end face of the second member is formed; and
pressing the columnar portion into the hole in the second member,
wherein by pressing the columnar portion into the hole, the corner of the columnar portion scrapes an inner surface of the hole and bites into the second member, to fix the columnar portion into the second member, and
wherein at the cross-section, the inner surface of the hole extends substantially along a circular shape having a diameter, and a length of the diagonal of the columnar portion is greater than the diameter, after the columnar portion has been pressed into the hole.

2. The method according to claim 1, wherein the diameter of the hole is constant from the first end face toward the second end face of the second member after the columnar portion has been pressed into the hole.

3. The method according to claim 1, wherein the hole includes:
a first hole portion extending from the first end face of the second member;
a second hole portion extending between the first hole portion and the second end face of the second member, the diameter of the inner surface, taken at the second hole portion being less than at the first hole portion;
and a tapered portion along which the diameter of the hole decreases gradually in the longitudinal direction, from the first hole portion to the second hole portion,
wherein the corner of the columnar portion scrapes the inner surface at the second hole portion, without scraping the first hole portion, and wherein after the columnar portion has been pressed into the hole,
the columnar portion extends along both the first hole portion and the second hole portion,
the cross-section of the columnar portion is taken at the second hole portion,
the length of the diagonal of the cross-sectional shape of the columnar portion is greater than the diameter at the second hole portion, and
a side surface of the columnar portion is entirely spaced away from the inner surface of the hole at the first hole portion.

4. The method according to claim 1, wherein the corner of the columnar portion scraping the inner surface and biting into the second member causes the corner of the columnar portion to be located radially outwardly of the circular shape formed by the hole, after the columnar portion has been pressed into the hole.

5. An electron source comprising:
a columnar portion that is made of a first material having an electron emission characteristic and an end face; and
a tubular portion that is disposed to surround the columnar portion and that is made of a second material having a higher work function and a lower strength than the first material, wherein the columnar portion is disposed in the tubular portion so that the entire side surface of the columnar portion is covered by the tubular portion, wherein the second material is glassy carbon,
wherein a hole extending in a direction from one end face toward the other end face is formed in the tubular portion, and
wherein, in a cross-section orthogonal to a longitudinal direction of the columnar portion, the columnar portion has a cross-sectional shape that is dissimilar to a cross-sectional shape of the hole in the tubular portion and a portion of a side surface of the columnar portion scrapes an inner surface of the tubular portion and bites into the tubular portion, thereby fixing the columnar portion to the tubular portion;
wherein a flat surface is formed by the end face of the columnar portion and the one end face of the tubular portion.

6. The electron source according to claim 5, wherein an end face of the columnar portion that constitutes an electron emission surface is substantially polygonal.

7. The electron source according to claim 5, wherein the first material is a material selected from the group consisting of rare earth borides, high melting point metals and their oxides, carbides and nitrides, and noble metal-rare earth alloys.

8. An emitter comprising the electron source according to claim 7.

9. A device comprising the emitter according to claim 8.

10. An electron source comprising:
a columnar portion that extends in a longitudinal direction and that is made of a first material having an electron emission characteristic and an end face; and
a tubular portion that is made of a second material that is an electron emission limiting material having a higher work function and a lower strength than the first material,
wherein the tubular portion forms a hole extending in the longitudinal direction from a first end face of the tubular portion toward a second end face of the tubular portion,
wherein the columnar portion is disposed in the tubular portion so that the entire side surface of the columnar portion is covered by the tubular portion, wherein the second material is glassy carbon, wherein a hole extending in a direction from one end face toward the other end face is formed in the tubular portion, wherein, in a cross-section orthogonal to a longitudinal direction of the columnar portion, the columnar portion has a cross-sectional shape that is dissimilar to a cross-sectional shape of the hole in the tubular portion and a portion of a side surface of the columnar portion scrapes an inner surface of the tubular portion and bites into the tubular portion, thereby fixing the columnar portion to the tubular portion, and wherein a flat surface is formed by the end face of the columnar portion and the one end face of the tubular portion.

11. The electron source according to claim 10, wherein a part of the side surface forming the corner of the columnar portion is recessed into the tubular portion, relative to the circular shape formed by the hole.

12. The electron source according to claim 10, wherein the cross-sectional shape of the columnar portion is a triangle, and wherein a circumscribed circle of the triangle has a diameter that is greater than the diameter of the circular shape formed by the hole.

13. The electron source according to claim 10, wherein the hole of the tubular portion includes a first hole portion having a first inner diameter, and a second hole portion having a second inner diameter that is less than the first inner diameter, wherein the columnar portion extends along both the first hole portion and the second hole portion of the tubular portion, wherein the cross-section of the electron source is taken at the second hole portion, and wherein in an additional cross-section of the electron source taken orthogonally to the longitudinal direction at the first hole portion, the columnar portion is free of contact from the tubular portion.

* * * * *